US007242019B2

(12) United States Patent
Wicker

(10) Patent No.: US 7,242,019 B2
(45) Date of Patent: Jul. 10, 2007

(54) SHUNTED PHASE CHANGE MEMORY

(75) Inventor: Guy Wicker, Southfield, MI (US)

(73) Assignee: Intel Corporation, Santa Clara, CA (US)

( * ) Notice: Subject to any disclaimer, the term of this patent is extended or adjusted under 35 U.S.C. 154(b) by 574 days.

(21) Appl. No.: 10/318,706

(22) Filed: Dec. 13, 2002

(65) Prior Publication Data

US 2004/0113135 A1    Jun. 17, 2004

(51) Int. Cl.
*H01L 29/02* (2006.01)
(52) U.S. Cl. .................................. 257/2; 257/3; 257/4
(58) Field of Classification Search ................. 257/2–5, 257/E45.002, E45.003, E45.004; 365/163, 365/148, 191, 168, 46
See application file for complete search history.

(56) References Cited

U.S. PATENT DOCUMENTS

| 3,920,461 | A | * | 11/1975 | Asahara et al. | ................ | 501/40 |
| 5,536,947 | A | * | 7/1996 | Klersy | ............................. | 257/3 |
| 5,812,441 | A | * | 9/1998 | Manning | .................... | 365/100 |
| 5,926,464 | A | * | 7/1999 | Fraser | ........................ | 370/259 |
| 5,933,365 | A | * | 8/1999 | Klersy et al. | ................ | 365/148 |
| 6,141,241 | A | * | 10/2000 | Ovshinsky et al. | ......... | 365/163 |
| 6,566,700 | B2 | * | 5/2003 | Xu | ............................. | 257/296 |
| 6,567,293 | B1 | * | 5/2003 | Lowrey et al. | ............. | 365/100 |
| 6,570,784 | B2 | * | 5/2003 | Lowrey | ....................... | 365/163 |
| 6,590,807 | B2 | * | 7/2003 | Lowrey | ....................... | 365/175 |
| 6,667,900 | B2 | * | 12/2003 | Lowrey et al. | ............. | 365/171 |

FOREIGN PATENT DOCUMENTS

EP          1 463 061    *    9/2004

OTHER PUBLICATIONS

American Heritage Dictionary, Second College Edition, 1982, p. 97.*

Hwang, Y.N., Hong, J.S., Lee, S.H., Ahn, S.J., Jeong, G.T., Koh, G.H., Kim, H.J., Jeong, W.C., Lee, S.Y., Park, J.H., Ryoo, K.C.., Horii, H., Ha, Y.H., Yi, J.H., Cho, W.Y., Kim, Y.T., Lee, K.H., Joo, S.H., Park, S.O., Jeong, U.I., Jeong, H.S. and Kim, Kinam, "Completely CMOS-Compatible Phase-Change Nonvolatile RAM Using NMOS Cell Transistors," presented at 2003 19th IEEE Non-Volatile Semiconductor Memory Workshop, Monterey, California, Feb. 26-20, 2003.

Ha, Y.H., Yi, J.H., Horii, H., Park, J.H., Joo, S.H., Park, S.O., Chung, U-In and Moon, J.T., "An Edge Contact Type Cell for Phase Change RAM Featuring Very Low Power Consumption," presented at IEEE 2003 Symposium on VLSI Technology, Kyoto, Japan, Jun. 12-14, 2003.

Hwang, Y.N., Hong, J.S., Lee, S.H., Ahn, S.J., Jeong, G.T., Koh, G.H., Oh, J.H., Kim, H.J., Jeong, W.C., Lee, S.Y., Park, J.H., Ryoo, K.C., Horii, H., Ha, Y.H., Yi, J.H., Cho, W.Y., Kim, Y.T., Lee, K.H., Joo, S.H., Park, S.O., Chung, U.I., Jeong, H.S. and Kim, Kinam, "Full Integration and Reliability Evaluation of Phase-change RAM Based on 0.24 mm-CMOS Technologies," presented at IEEE 2003 Symposium on VLSI Technology, Kyoto, Japan, Jun. 12-14, 2003.

(Continued)

*Primary Examiner*—Sara Crane
(74) *Attorney, Agent, or Firm*—Trop, Pruner & Hu, P.C.

(57) ABSTRACT

By using a resistive film as a shunt, the snapback exhibited when transitioning from the reset state or amorphous phase of a phase change material, may be reduced or avoided. The resistive film may be sufficiently resistive that it heats the phase change material and causes the appropriate phase transitions without requiring a dielectric breakdown of the phase change material.

26 Claims, 3 Drawing Sheets

OTHER PUBLICATIONS

Horii, H., Yi, J.H., Park, J.H., Ha, Y.H., Baek, I.G., Park, S.O., Hwang, Y.N., Lee, S.H., Kim, Y.T., Lee, K.H., Chung, U-In and Moon, J.T., "A Novel Cell Technology Using N-doped GeSbTe Films for Phase Change RAM," presented at IEEE 2003 Symposium on VLSI Technology, Kyoto, Japan, Jun. 12-14, 2003.

* cited by examiner

SHUNTED PHASE CHANGE MEMORY

BACKGROUND

This invention relates generally to electronic memories and particularly to electronic memories that use phase change material.

Phase change materials may exhibit at least two different states. The states may be called the amorphous and crystalline states. Transitions between these states may be selectively initiated. The states may be distinguished because the amorphous state generally exhibits higher resistivity than the crystalline state. The amorphous state involves a more disordered atomic structure. Generally any phase change material may be utilized. In some embodiments, however, thin-film chalcogenide alloy materials may be particularly suitable.

The phase change may be induced reversibly. Therefore, the memory may change from the amorphous to the crystalline state and may revert back to the amorphous state thereafter, or vice versa, in response to temperature changes. In effect, each memory cell may be thought of as a programmable resistor, which reversibly changes between higher and lower resistance states. The phase change may be induced by resistive heating.

Existing phase change memories may exhibit unpredictably current/voltage characteristics in transitioning from the amorphous to the crystalline phases.

DETAILED DESCRIPTION

Figure 1:
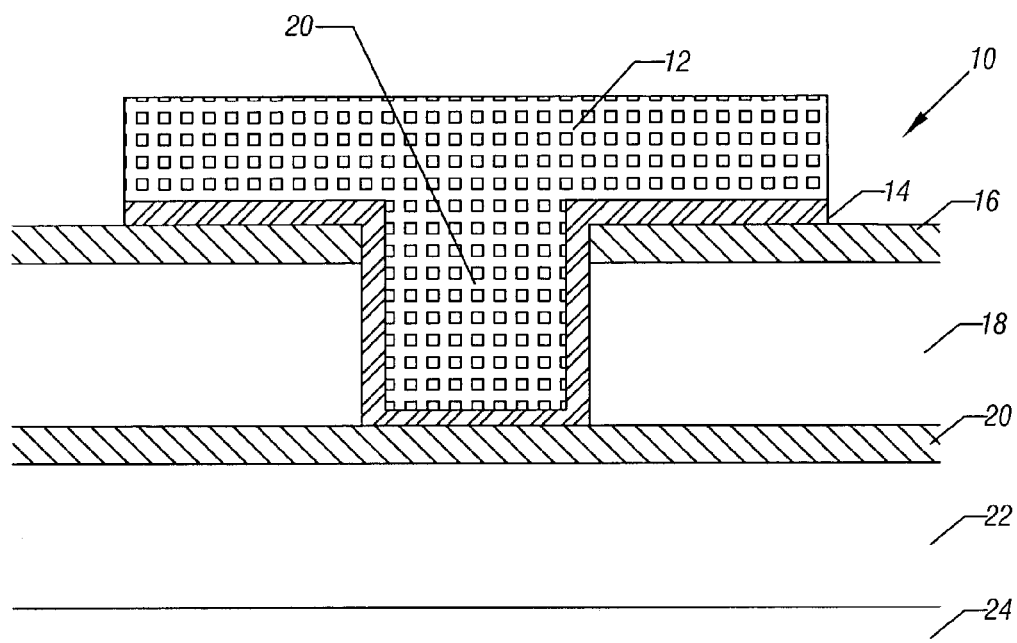
FIG. 1 is an enlarged cross-sectional view of one embodiment of the present invention.

Referring to FIG. 1, a phase change memory 10 may include a phase change material 12, such as a chalcogenide material, located in a pore 20. The pore 20 may be defined by a resistive film 14 formed in an aperture through an upper electrode 16 and an insulating layer 18. In one embodiment, the insulating layer 18 may be an oxide layer. The U-shaped resistive film 14 sits on top of a lower electrode 20 which in turn may be positioned over an insulating film 22. The film 22 may be located over a substrate 24.

An electrical potential may be applied to the lower electrode 20 to cause the current to flow through the resistive film 14 to the upper electrode 16. As a result of the resistance of the film 14, the phase change material 12 may be heated. As a result, the material 12 may be transitioned between its amorphous and crystalline states.

Current phase change memory elements exhibit instability in the set/reset behavior. Metal nitride electrodes tend to be unstable at higher temperatures and higher fields. An electrical pulse either melts or quenches the phase change material into an insulating amorphous state or heats and crystallizes the material into a conductive crystalline state. When the phase change material is in the amorphous phase, a large electric field is needed to force sufficient current to heat the memory and to store a bit. This leads to a switching event where the higher resistance insulating material rapidly becomes conductive. The switching process is very non-uniform and there are large variations in the voltage required in the region where the subsequent current conducts. As a result, unpredictable switching in the phase of the material may occur.

Figure 4:
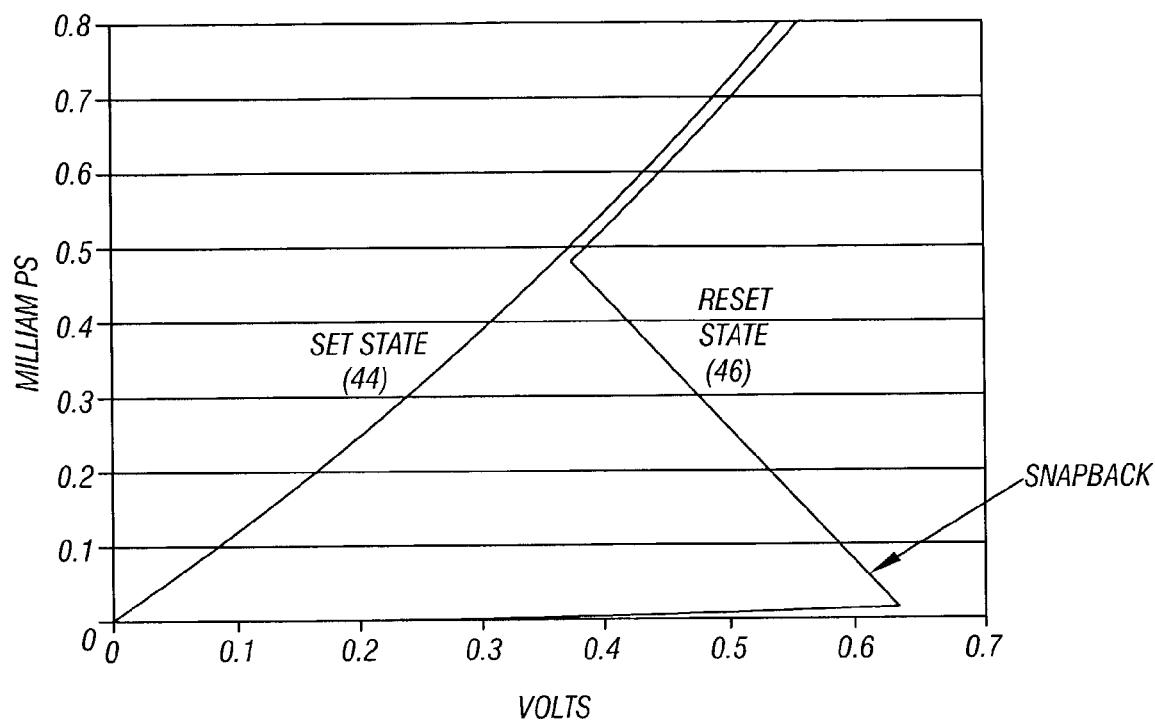
FIG. 4 is a graph of current versus voltage in accordance with an embodiment from the prior art.

For example, referring to FIG. 4, as the voltage is increased in the reset (amorphous phase) state 46, the current slowly increases until a snapback point is reached. At the snapback point the voltage begins to fall but the current rises.

By shunting current around the amorphous phase change material 12 using the resistive film 14, the snapback may be largely reduced or eliminated. The shunt resistance from the resistive film 14 may be significantly higher than the set resistance of the memory element so that the phase change resistance difference is detectable. The shunt resistance of the resistor film 14 may be low enough so that when voltages approaching the threshold voltage of the memory element are present, the resistive film 14 heats up significantly. In other words, the resistance of the film 14 may be higher than the memory's set resistance and lower than its reset resistance.

Figure 3:
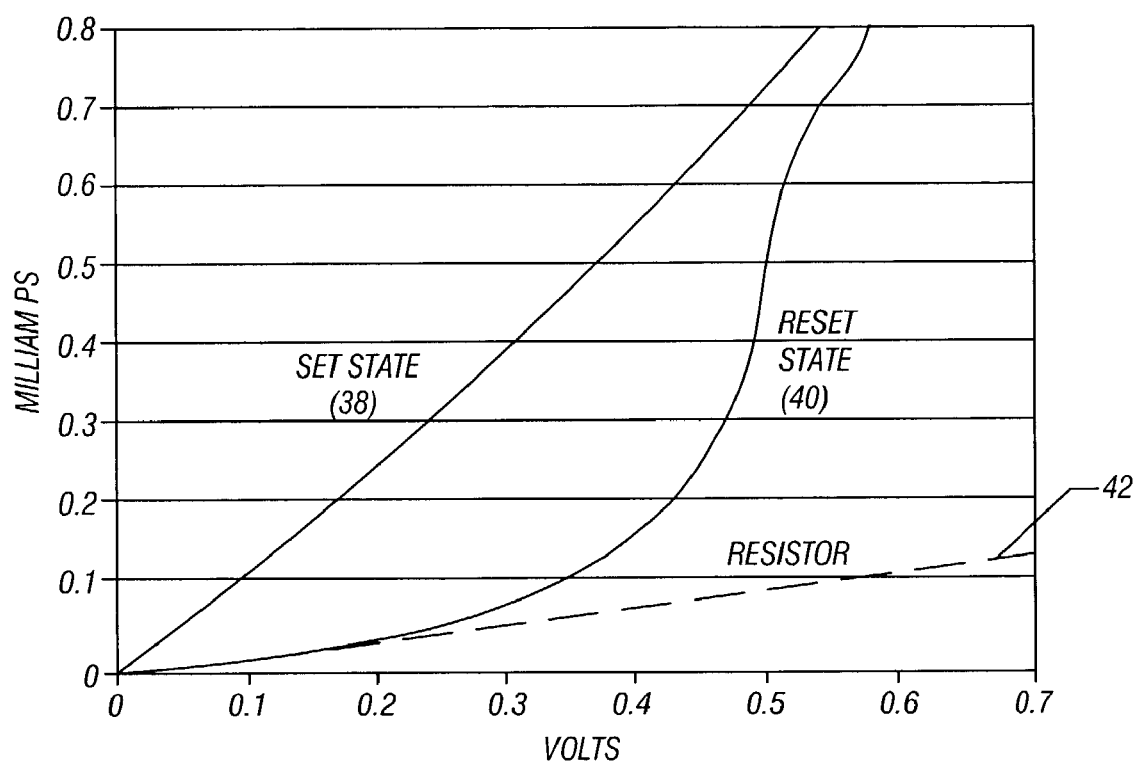
FIG. 3 is a graph of current versus voltage in accordance with one embodiment of the present invention.

This heat, generated by the film 14, changes the conductivity of the amorphous phase change material 12 in close proximity to the resistive film 14. This heated phase change material 12 becomes more electrically conductive as indicated in FIG. 3. As shown in FIG. 3, the reset state 40 may not exhibit substantial (or any) snapback, but instead steadily increases the current conducted with increasing voltage.

If the amorphous phase change material becomes conductive enough, the voltage across the memory element never becomes high enough to cause threshold switching. The instabilities resulting from this threshold switching do not occur in the phase transition from the amorphous phase or the reset state to the crystalline phase or set state so that the state transition occurs in a predictable fashion.

In one embodiment shown in FIG. 3, as the reset voltage increases to about 0.4 to 0.5 volts, the heating of the phase change material 12 becomes sufficient to change the conductivity of the memory element and it asymptotically approaches the same current as the set condition. Here the voltage across the memory element in the reset condition never approaches the threshold voltage (around 0.65 volts), so the switching event or snapback, shown in FIG. 4, never takes place.

While in the embodiment illustrated in FIG. 1, the resistive film 14 is shown extending completely from the lower electrode 20 to the upper electrode 16, in some embodiments it may be sufficient to merely shunt the portion of the phase change material 12 that switches between the amorphous and the crystalline phases. This avoids the need to rely on the dielectric breakdown of the phase change material 12.

A variety of materials may be suitable for the resistive film 14, including silicon carbide and metal nitrides. Suitable metals for the metal nitride include titanium, silicon, titanium aluminum, titanium carbon, tantalum, tantalum aluminum, and tantalum carbon, to mention a few examples. In some cases, it may be desirable to use an adhesion promoter between the resistive film 14 and the insulator 18.

Figure 2:
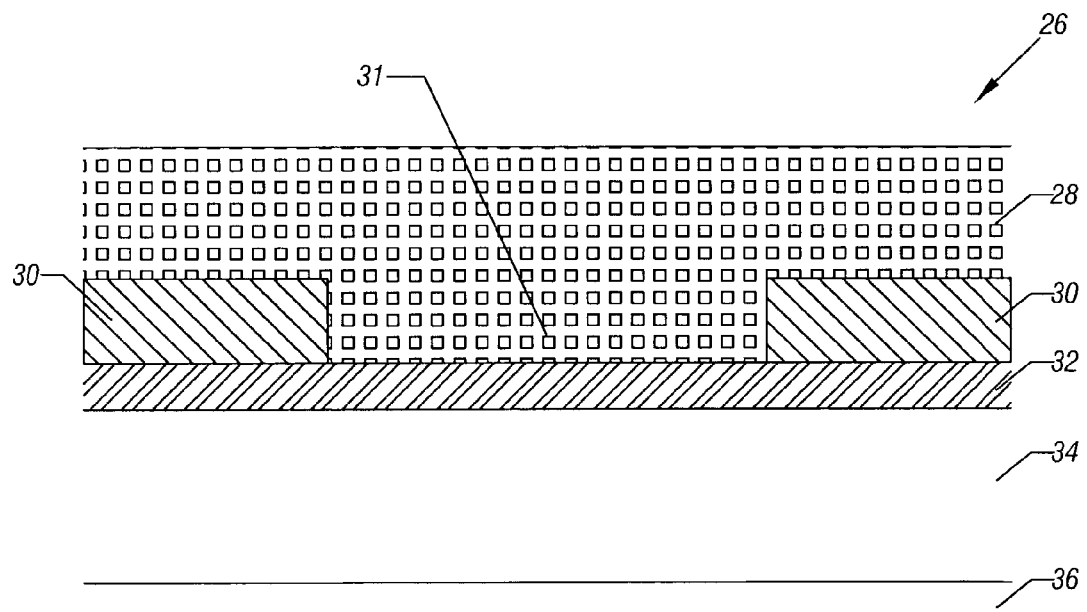
FIG. 2 is an enlarged cross-sectional view of another embodiment of the present invention.

Referring to FIG. 2, in accordance with another embodiment of the present invention, a lateral pore structure may include a phase change material 28 over two electrodes 30 having a separation 31. The electrodes 30 and the separation 31 may be positioned over the resistive film 32 which corresponds to the film 14 in the previous embodiment. An insulator 34 may be positioned over a substrate 36. The resistive film 32 functions like the resistive film 14 in the previous embodiment.

Figure 5:
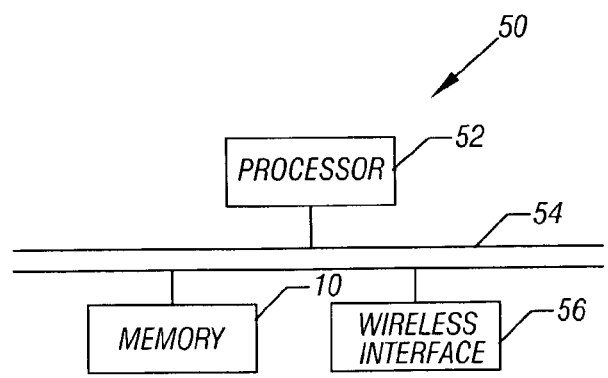
FIG. 5 is a schematic depiction of a system in accordance with one embodiment of the present invention.

Referring to FIG. 5, a processor-based system 50 may include a processor 52 coupled to a bus 54. The phase change memory 10 may also be coupled to the bus as may be a wireless interface 56. The interface 56 may be, for example, a radio frequency interface and may include a transceiver and/or an antenna such as a depole or other antenna. Thus, in some embodiments, the system 50 may be a cellular telephone or other wireless or radio frequency processor-based system. In other embodiments, non-wireless applications may be implemented. However, of course, the present invention is in no way limited to any one particular application of the phase change memory 10.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A phase change memory comprising:
    a phase change material that includes at least a portion that transitions between amorphous and crystalline phases; and
    said memory having no snapback in the transition from the amorphous to the crystalline phases.

2. The memory of claim 1 including a pair of electrodes and said phase change material is positioned at least in part between said electrodes.

3. The memory of claim 2 including a resistive layer extending along said phase change material sufficiently to shunt a portion of the phase change material that transitions between the amorphous and crystalline phases.

4. The memory of claim 1 including a pair of electrodes and a pore between said electrodes, said pore including said phase change material.

5. A phase change memory comprising:
    a first electrode and a second electrode spaced from one another;
    a phase change material that includes a portion that transitions between amorphous and crystalline phases, said phase change material extending between said first and second electrodes; and
    a resistive shunt to shunt current from said first to said second electrode around the portion of the phase change material that transitions between the crystalline and amorphous phases, said shunt having a resistance higher than the set resistance of said material and lower than the reset resistance of said material.

6. The memory of claim 5 wherein said memory has no snapback.

7. The memory of claim 5 including a pair of electrodes spaced from one another, wherein said first electrode having an opening and said phase change material extending through said opening to said second electrode.

8. The memory of claim 5, said phase change material extending into said space between said electrodes, said electrodes being substantially co-planar.

9. The memory of claim 5 wherein said shunt shunts the entire phase change material.

10. A method comprising:
    forming a phase change memory between a pair of spaced electrodes, said phase change memory including phase change material that transitions between amorphous and crystalline phases; and
    providing a resistive shunt between said first and said second electrodes around the portion of said phase change material, in sufficient proximity to heat said phase change material, said shunt having a resistance between the reset resistance of said memory and the set resistance of said memory.

11. The method of claim 10 including providing a pair of spaced electrodes and positioning said phase change material at least in part between said electrodes.

12. The method of claim 10 including extending said shunt along said phase change material.

13. The method of claim 11 including forming a pair of spaced electrodes and positioning said phase change material between said electrodes, and causing said shunt to extend from one of said electrodes to the other of said electrodes.

14. A system comprising:
    a processor;
    a phase change memory coupled to said processor, said memory including a pair of spaced electrodes, a phase change material that transitions between amorphous and crystalline phases between said spaced electrodes, and a resistive shunt to shunt current between said electrodes around a portion of said phase change material that transitions between crystalline and amorphous phases, said shunt having a resistance higher than the set resistance of said material and lower than the reset resistance of said material; and
    a wireless interface coupled to said processor.

15. The system of claim 14 wherein said memory has no snapback.

16. The system of claim 14 including a pair of electrodes spaced from one another, one of said electrodes having an opening and said phase change material extending through said opening to the other of said electrodes.

17. A phase change memory comprising:
    a first electrode and a second electrode;
    a phase change material that includes at least a portion that transitions between amorphous and crystalline phases, said phase change material extending between said first and second electrodes; and
    a resistive layer extending along said phase change material from said first to said second electrode to shunt at least a portion of the phase change material, wherein the resistance of said resistive layer is higher than the set resistance of the memory element.

18. The memory of claim 17 including a pair of electrodes and said phase change material being positioned at least in part between said electrodes.

19. The memory of claim 18 wherein said resistive layer extends from one of said electrodes along said phase change material.

20. The memory of claim 19 wherein said resistive layer extends from one of said electrodes to the other of said electrodes.

21. The memory of claim 18 wherein said electrodes are positioned one over the other and an insulating film is located between said electrodes.

22. The memory of claim 21 including an opening in one of said electrodes, said phase change material extending into said opening.

23. The memory of claim 22 wherein said electrodes are separated by an insulating layer.

24. The memory of claim 17 wherein said resistive layer reduces the snapback when transitioning the phase change material from the amorphous phase to the crystalline phase.

25. The memory of claim 17 wherein the resistance of said resistive layer is low enough so that when voltages approaching the threshold voltage of the memory are present, the resistive layer heats up.

26. The memory of claim 25 wherein the resistive layer has a resistance lower than the reset resistance of the memory and higher than the set resistance of the memory.

* * * * *

UNITED STATES PATENT AND TRADEMARK OFFICE
CERTIFICATE OF CORRECTION

PATENT NO. : 7,242,019 B2
APPLICATION NO. : 10/318706
DATED : July 10, 2007
INVENTOR(S) : Guy Wicker Page 1 of 1

It is certified that error appears in the above-identified patent and that said Letters Patent is hereby corrected as shown below:

Column 3:

Claim 1
Lines 28-30, "; and said memory having no snapback in the transition from the amorphous to the crystalline phases" should be --without a device current-voltage characteristic exhibiting increasing current with decreasing voltage--;

Claim 6
Lines 54-55, "has no snapback" should be --does not exhibit a device current-voltage characteristic having increasing current with decreasing voltage--;

Column 4:

Claim 15
Lines 33-34, "has no snapback" should be --does not exhibit a device current-voltage characteristic having increasing current with decreasing voltage--;

Column 5:

Claim 24
Line 3, after "phase" insert --, snapback being the phenomenon of decreasing voltage with increasing current--.

Signed and Sealed this

Twenty-eighth Day of August, 2007

JON W. DUDAS
*Director of the United States Patent and Trademark Office*